United States Patent
Arp et al.

(10) Patent No.: US 10,564,664 B2
(45) Date of Patent: Feb. 18, 2020

(54) INTEGRATED SKEW CONTROL

(71) Applicant: International Business Machines Corporation, Armonk, NY (US)

(72) Inventors: Andreas Arp, Nufringen (DE); Andre Hertwig, Waldenbuch (DE); Michael Koch, Ehningen (DE); Matthias Ringe, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 221 days.

(21) Appl. No.: 15/593,057

(22) Filed: May 11, 2017

(65) Prior Publication Data
US 2018/0329448 A1    Nov. 15, 2018

(51) Int. Cl.
*G06F 1/10*     (2006.01)
*G06F 1/12*     (2006.01)
*H03K 5/14*     (2014.01)
*H03K 19/003*   (2006.01)

(52) U.S. Cl.
CPC ............... *G06F 1/10* (2013.01); *G06F 1/12* (2013.01); *H03K 5/14* (2013.01); *H03K 19/00323* (2013.01)

(58) Field of Classification Search
CPC ..... G06F 1/12; G06F 1/14; G06F 1/10; G06F 5/06; G06F 13/1689; G06F 1/08; G06F 1/04; G06F 1/3202; G06F 9/4825; G06F 11/0757; G06F 11/3419; G11C 7/22
See application file for complete search history.

(56) References Cited

U.S. PATENT DOCUMENTS

| | | | |
|---|---|---|---|
| 5,465,347 A | 11/1995 | Chao et al. | |
| 5,628,000 A | 5/1997 | Kashiyama et al. | |
| 6,150,865 A | 11/2000 | Fluxman et al. | |
| 6,622,255 B1 | 9/2003 | Kurd et al. | |

(Continued)

FOREIGN PATENT DOCUMENTS

WO    2009108391 A1    9/2009

OTHER PUBLICATIONS

Ravi, M., "Modeling and Simulation of Clock Distribution Networks using Delay-Locked Loops," Thesis for degree of Master of Science, Jul. 2006, 74 pages.

(Continued)

*Primary Examiner* — Zahid Choudhury
(74) *Attorney, Agent, or Firm* — Nathan M. Rau

(57) ABSTRACT

Disclosed aspects relate to a clock distribution network of a synchronous logic device. The synchronous logic device has sub-circuits having different clock domains. The clock domains form a hierarchical structure. The clock distribution network has a clock source to provide a global clock signal. A programmable delay line associated with a sub-circuit generates a local clock signal for the sub-circuit by delaying the signal. A global skew control circuit can manage clock skew between the local clock signals. The global skew control circuit may adjust a delay, determine initial operations for the delay lines, verify whether it is possible to perform the initial operations, and perform a correction operation. The correction operation can include correcting the control commands such that the corrected commands lead to the same change of skew adjustment between the local clocks.

11 Claims, 12 Drawing Sheets

(56) References Cited

U.S. PATENT DOCUMENTS

| | | | |
|---|---|---|---|
| 6,963,229 | B2 | 11/2005 | Lin |
| 7,017,132 | B2 | 3/2006 | Hou et al. |
| 7,251,765 | B2 | 7/2007 | Kushiyama et al. |
| 7,317,342 | B2 | 1/2008 | Saint-Laurent |
| 7,765,425 | B1 | 7/2010 | Searles et al. |
| 7,770,049 | B1 | 8/2010 | Searles et al. |
| 7,956,664 | B2 | 6/2011 | Chueh et al. |
| 7,971,088 | B2 | 6/2011 | Jung et al. |
| 8,205,182 | B1 | 6/2012 | Zlatanovici et al. |
| 8,817,936 | B2 | 8/2014 | Dominguez |
| 2003/0197537 | A1 | 10/2003 | Saint-Laurent |
| 2007/0006011 | A1* | 1/2007 | Martin .............. G06F 1/10 713/503 |
| 2008/0115004 | A1 | 5/2008 | Braun et al. |
| 2008/0150605 | A1 | 6/2008 | Chueh et al. |
| 2013/0336082 | A1 | 12/2013 | Khawshe et al. |
| 2014/0306746 | A1 | 10/2014 | Meneghini |
| 2015/0280722 | A1 | 10/2015 | Liu et al. |
| 2015/0323958 | A1 | 11/2015 | Arabi |

OTHER PUBLICATIONS

Rusu et al., "Clock Generation and Distribution for the First IA-64 Microprocessor," 2000 IEEE International Solid-Circuits Conference, 2000. Digest of Technical Papers, 2 pages. DOI: 10.1109/ISSCC.2000.839738.

Geannopoulos et al., "An Adaptive Digital Deskewing Circuit for Clock Distribution Networks," 1998 IEEE International Solid-State Circuits Conference (ISSCC98), Digest of Technical Papers, First Edition, Session 25, Paper SP 25.3, 1998, pp. 400-401. DOI: 10.1109/ISSCC.1998.672552.

Tanoi et al., "A 250-622 MHz Deskew and Jitter-Suppressed Clock Buffer Using Two-Loop Architecture," IEEE Journal of Solid-State Circuits, vol. 31, No. 4, Apr. 1996, pp. 487-493. DOI: 10.1109/4.499724.

Hoke et al., "Self-timed interface of the input/output subsystem of the IBM eServer z900," IBM Journal of Research and Development, vol. 46, No. 4/5, Jul./Sep. 2012, pp. 447-460.

Arp et al., "Skew Control," U.S. Appl. No. 15/593,079, filed May 11, 2017.

List of IBM Patents or Patent Applications Treated as Related, Signed May 11, 2017, 2 pages.

Arp et al., "Skew Control," U.S. Appl. No. 16/423,560, filed May 28, 2019.

List of IBM Patents or Patent Applications Treated as Related, Signed May 28, 2019, 2 pages.

\* cited by examiner

INTEGRATED SKEW CONTROL

BACKGROUND

This disclosure relates generally to computer systems and, more particularly, relates to a logic device comprising a clock source and several clock domains as well as a method for synchronizing clock domains of a logic device.

SUMMARY

Aspects of the disclosure relate to a logic device having a clock source and several clock domains. Moreover, the disclosure relates to synchronizing clock domains of a logic device. A logic device may comprise several sub-circuits each having an associated clock domain. The clock domains of two sub-circuits exchanging data have to be in synchronization to avoid data loss and/or data faults. The sub-circuits may be configured to communicate in a hierarchical structure. Each sub-circuit can communicate with one or more daughter sub-circuits and a mother sub-circuit.

Disclosed aspects relate to integrated skew control. A synchronous logic device may comprise multiple sub-circuits belonging to different clock domains. The clock distribution network may comprise a clock source operable for providing a global clock signal. At least one programmable delay line may be associated with a certain sub-circuit operable for generating a local clock signal. A global skew control circuit may be operable for adjusting a delay caused by the delay line, determining initial operations for the delay line, verifying whether it is possible to perform the initial operations, and performing a correction operation.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
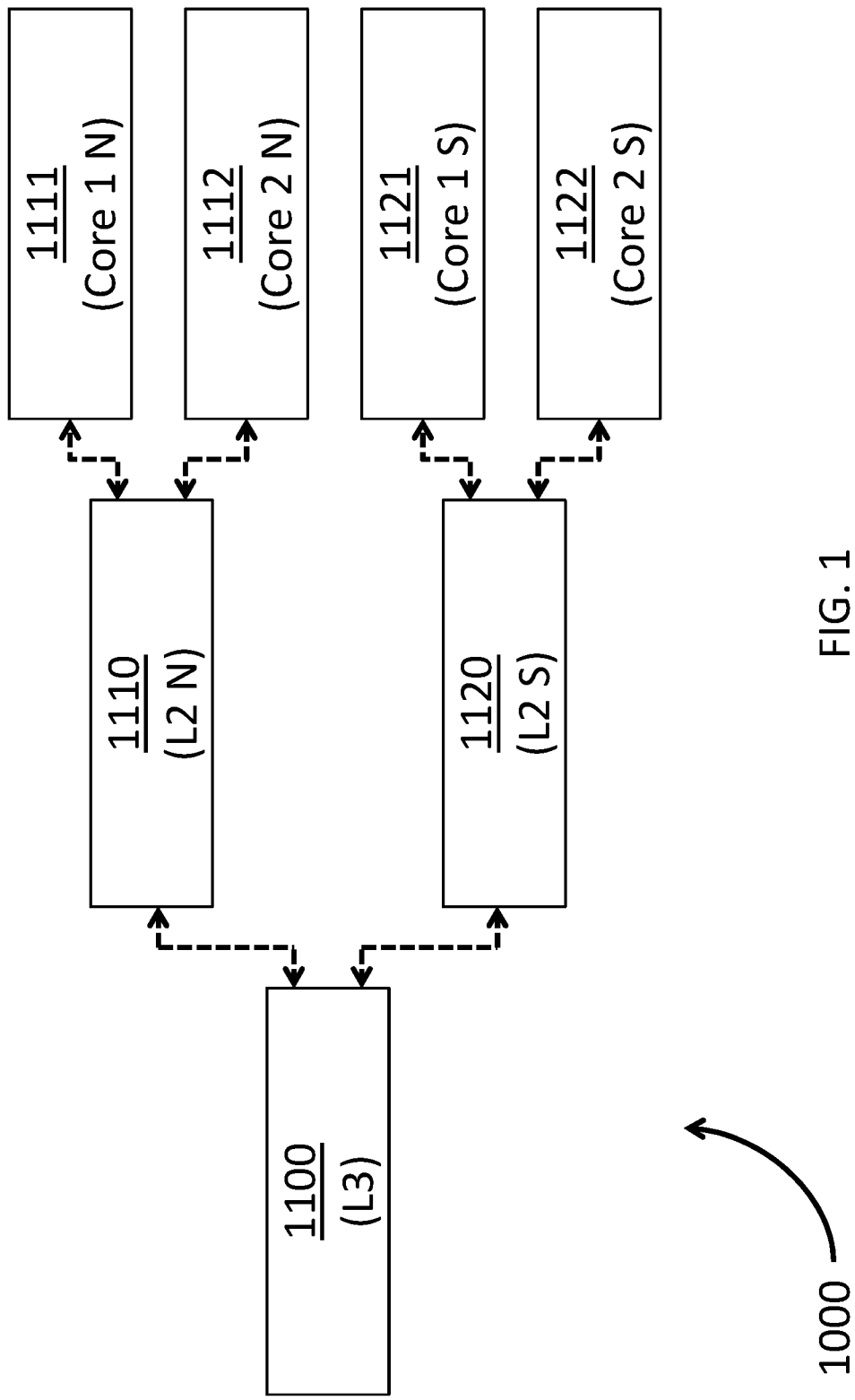
FIG. 1 shows a logic device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the disclosure relate to a logic device comprising a clock source and several clock domains. Moreover, the disclosure relates to a method for synchronizing clock domains of a logic device. A logic device may comprise several sub-circuits each having an associated clock domain. The clock domains of two sub-circuits exchanging data have to be in synchronization to avoid data loss and/or data faults. The sub-circuits may be configured to communicate in a hierarchical structure, wherein each sub-circuit communicates with one or more daughter sub-circuits and a mother sub-circuit (except for the root sub-circuit).

For example, a microprocessor may comprise four processor cores, wherein two of the four processor cores may exchange data via a first second level cache and the other two of the four processor cores may exchange data via a second level cache. To allow for a data exchange between the two branches, a third level cache is provided, which communicates with the first second level cache and the second level cache. Thus, the first second level cache has two daughter sub-circuits, namely, two of the four processor cores, and one mother sub-circuit, namely, the third level cache. The seven sub-circuits (one third level cache, two second level caches, and four processor cores each including a first level cache) each have an associated clock domain. The clock domains are (directly or indirectly) driven by a common global clock source. However, the local clock signal of one clock domain of one sub-circuit may be early with respect to another clock-domain of a sub-circuit communicating with the aforementioned sub-circuit. The difference may also be called "skew". Delay lines may be provided between the global clock source and the local clock sources of said clock domains to ensure proper data exchange between the sub-circuits.

During operation of the microprocessor, the skew between different clock domains may change. A clock skew controller may adjust a skew between a first clock, which is input to a first clock mesh, and a second clock, which is input to a second clock mesh, including a pulse generator adapted to output a pulse signal corresponding to a delay time between a first output clock output from the first clock mesh and a second output clock output from the second clock mesh, a pulse width detector adapted to generate a digital signal corresponding to a pulse width of the pulse signal, and a clock delay adjuster adapted to delay one of the first and second clocks by a time corresponding to the digital signal.

Aspects of the disclosure include a method, system, and computer program product for integrated skew control. A synchronous logic device may comprise multiple sub-circuits belonging to different clock domains. The clock distribution network may comprise a clock source operable for providing a global clock signal. At least one programmable delay line may be associated with a certain sub-circuit operable for generating a local clock signal. A global skew control circuit may be operable for adjusting a delay caused by the delay line, determining initial operations for the delay line, verifying whether it is possible to perform the initial operations, and performing a correction operation.

According to a first aspect, it is proposed a clock distribution network of a synchronous logic device, wherein the synchronous logic device comprises multiple sub-circuits belonging to different clock domains, wherein the clock domains form a hierarchical structure; wherein the clock distribution network comprises a clock source operable for providing a global clock signal, at least one programmable delay line associated with a certain sub-circuit operable for generating a local clock signal for said sub-circuit by delaying the global clock signal or a signal derived therefrom; a global skew control circuit for managing/reducing/lessening/minimizing clock skew between the local clock signals; and wherein the global skew control circuit is operable for adjusting a delay caused by the delay line, determining initial operations for the delay lines for either reducing a delay caused by the respective programmable delay line or leaving the delay constant, verifying, based on a current state of the delay lines, whether it is possible to perform the initial operations, and, based on the verifying, performing a correction operation, the correction operation comprising correcting the control commands such that the corrected commands lead to the same change of skew adjustment between the local clocks, the corrected commands including at least one control command for increasing a delay caused by a programmable delay line.

A first embodiment of the clock distribution network prescribes that the verifying comprises checking whether the control commands include at least one command destined to a programmable delay line that operates already at a minimum delay.

According to another embodiment of the clock distribution network the programmable delay lines are operable for delaying the global clock signal or the signal derived therefrom by a number of delay increments, the command includes a positive or negative number of increments by which the delay caused by a particular programmable delay line shall be adjusted, and the correction operation comprises checking whether all programmable delay lines controlled by the global skew control circuit can increase the respective number of delay increments; and, if the result of the checking is that all programmable delay lines can increase the respective delay then increasing the number of increments of each determined command.

Further, an embodiment of the clock distribution network prescribes that if the result of the checking is that at least one programmable delay line cannot increase the number of delay increments then iteratively determining corrected commands for each programmable delay line controlled by the global skew control circuit starting with a programmable delay line associated with a clock domain located at the bottom of the hierarchical structure.

In another embodiment of the clock distribution network, the synchronous logic device comprises a microprocessor and wherein the sub-circuits comprise at least one of a processor core including a first level cache, a second level cache, a third level cache.

Additionally, in an embodiment of the clock distribution network, the global skew control circuit is operable for managing/reducing/lessening/minimizing clock skew between at least some local clock signals by regularly adjusting the delay caused by at least one programmable delay line when in a deskewing operating mode, and disabling adjusting the delays of the programmable delay lines when in a locked operating mode.

Further, an embodiment of the clock distribution network prescribes that the global skew control circuit is operable for transitioning into the deskewing operating mode in response to enabling and/or disabling clock domains.

In another embodiment of the clock distribution network, the global skew control circuit is operable for transitioning into the deskewing operating mode in response to disabling the clock domain associated with the programmable delay line causing the lowest delay among the programmable delay lines of enabled clock domains.

Additionally, in an embodiment, the clock distribution network further comprises at least one skew sensor adapted for generating a sensor signal indicative of a clock skew between two local clock signals and the global skew control circuit is operable for repeatedly acquiring the sensor signal of the at least one skew sensor, comparing sensor signals acquired at different points in time with each other, and transitioning to the locked operating mode based on the comparison. This may be called "one shot mode".

According to a second aspect, it is proposed a method for operating a synchronous logic device, wherein the synchronous logic device comprises multiple sub-circuits belonging to different clock domains and the clock domains form a hierarchical structure, wherein the method comprises providing a global clock signal, generating a local clock signal by delaying with a programmable delay line the global clock signal or a signal derived therefrom, and managing/reducing/lessening/minimizing clock skew between the local clock signals, wherein managing/reducing/lessening/minimizing clock skew between local clock signals comprises adjusting a delay caused by the delay line, determining initial operations for the delay lines for either reducing a delay caused by the respective programmable delay line or leaving the delay constant, verifying, based on a current state of the delay lines, whether it is possible to perform the initial operations and, based on the verifying, performing a correction operation, the correction operation comprising correcting the control commands such that the corrected commands lead to the same change of skew adjustment between the local clocks, the corrected commands including at least one control command for increasing a delay caused by a programmable delay line.

In a first embodiment of the method, verifying comprises checking whether the control commands include at least one command destined to a programmable delay line that operates already at a minimum delay.

Additionally, an embodiment of the method prescribes that the programmable delay lines are operable for delaying the global clock signal or the signal derived therefrom by a number of delay increments, that the command includes a positive or negative number of increments by which the delay caused by a particular programmable delay line shall be adjusted, and that the correction operation comprises checking whether all programmable delay lines can increase the respective number of delay increments, and, if the result of the checking is that all programmable delay lines can increase the respective delay then increasing the number of increments of each determined command.

Further, in an embodiment of the method, the correction operation comprises, if the result of the checking is that at least one programmable delay line cannot increase the number of delay increments then iteratively determining corrected commands for each programmable delay line controlled by the global skew control circuit starting with a programmable delay line associated with a clock domain located at the bottom of the hierarchical structure.

In another embodiment, the method comprises managing/reducing/lessening/minimizing clock skew between at least some local clock signals by regularly adjusting the delay caused by at least one programmable delay line when in a deskewing operating mode, disabling adjusting the delays of the programmable delay lines when in a locked operating mode.

Additionally, an embodiment of the method prescribes selectively enabling or disabling clock domains, and transitioning into the deskewing operating mode in response to enabling and/or disabling clock domains.

Further, in an embodiment, the method comprises transitioning into the deskewing operating mode in response to disabling the clock domain associated with the programmable delay line causing the lowest delay among the programmable delay lines of enabled clock domains. This may be called "two shot mode".

In another embodiment of the method, the clock distribution network comprises at least one skew sensor adapted for generating a sensor signal indicative of a clock skew between two local clock signals, and the method comprises repeatedly acquiring the sensor signal of the at least one skew sensor, comparing sensor signals acquired at different points in time with each other, and transitioning to the locked operating mode based on the comparison. Altogether, aspects of the disclosure can have performance or efficiency benefits.

FIG. 1 shows a logic device 1000 comprising a sub-circuit 1110 and a sub-circuit 1120. Each of the sub-circuits 1110, 1120 has one mother sub-circuit 1100 and each of the sub-circuits 1110, 1120 has at least two daughter sub-circuits 1111, 1112 and 1121, 1122, respectively. In the embodiment shown in FIG. 1 the arrangement of the sub-circuits 1100, 1110, 1120, 1111, 1112, 1121 and 1122 corresponds to a binary tree. However, within the scope of the present disclosure it is also conceivable that one sub-circuit comprises more than only two daughter sub-circuits. For example, a sub-circuit may have three daughter sub-circuits which have to be deskewed. The sub-circuits may all have an associated clock domain, wherein the clock domains may be driven from a common global clock source. The clock domains may be operated with different frequencies. For example, the operating frequency of the clock domain associated with the sub-circuit 1100 may be half of the operating frequency of the sub-circuits 1110, 1120.

Not all sub-circuits 1100, 1110, 1120, 1111, 1112, 1121 and 1122 have to be enabled at the same time. For example, only the sub-circuits 1100, 1110, 1120, 1111 and 1112 may need to be enabled for a certain operation. Typically, the sub-circuit 1100 which has no mother sub-circuit will always be enabled.

As indicated with dashed arrows each sub-circuits may exchange data with its mother sub-circuits and its daughter sub-circuits. In the example shown in FIG. 1, the sub-circuit 1100 may correspond to a level-3-cache (L3-cache), the sub-circuits 1110, 1120 to two level-2-caches (L2-caches), which may be distinguished using the identifier north (N) and south (S), and the sub-circuits 1111, 1112, 1121 and 1122 may correspond to cores 0 and 1 of the northern branch and cores 0 and 1 of the southern branch.

Figure 2:
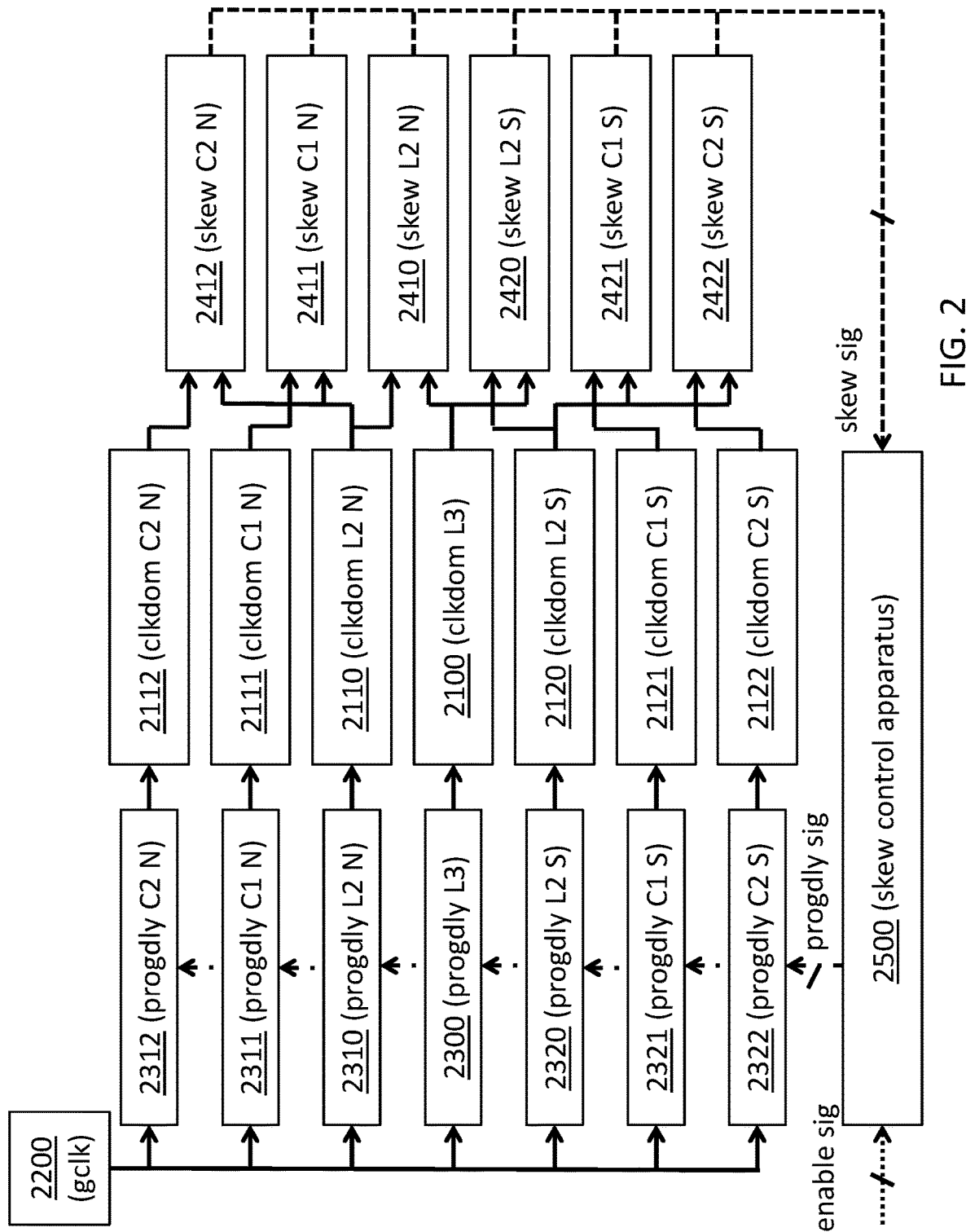
FIG. 2 shows a clock distribution network.

FIG. 2 illustrates a clock distribution network for the logic device shown in FIG. 1. The clock distribution network comprises clock domains 2100, 2110, 2120, 2111, 2112, 2121 and 2122 corresponding to the sub-circuits 1100, 1110, 1120, 1111, 1112, 1121 and 1122. A global clock source 2200 provides a global clock signal for the clock domains 2100, 2110, 2120, 2111, 2112, 2121 and 2122. In the clock path between the global clocks source 2200 and the clock domains 2100, 2110, 2120, 2111, 2112, 2121 and 2122 programmable delay lines 2300, 2310, 2320, 2311, 2312, 2321 and 2322 are provided. Although not shown in the figure, further actuators like buffers, dividers may be provided between the global clock source 2200 and the clock domains 2100, 2110, 2120, 2111, 2112, 2121 and 2122. The additional actuators may be provided before or after the programmable delay lines 2300, 2310, 2320, 2311, 2312, 2321 and 2322.

Moreover, the clock distribution network comprises skew sensors 2410, 2420, 2411, 2412, 2421 and 2422 indicating whether the local clock signal at the output of each clock domain 2100, 2110, 2120, 2111, 2112, 2121 and 2122 arrives later than the clock domain 2100, 2110 and 2120 associated with the mother sub-circuit 1100, 1110 and 1120 of the respective sub-circuits 1110, 1120, 1111, 1112, 1121 and 1122.

The skew sensors 2410, 2420, 2411, 2412, 2421 and 2422 transmit the skew information to a skew control circuit 2500. The skew control circuit 2500 may further receive enable information indicating, which sub-circuits of the sub-circuits 1110, 1120, 1111, 1112, 1121 and 1122 are enabled. It may be assumed that the root sub-circuit 1100 is always enabled. Based on the signals from the skew sensors 2410, 2420, 2411, 2412, 2421 and 2422 and the enable signals, the skew control circuit 2500 determines the control signals for the programmable delay lines 2300, 2310, 2320, 2311, 2312, 2321 and 2322, i.e. the delay to be inserted in the respective clock paths. The programmable delay lines 2300, 2310, 2320, 2311, 2312, 2321 and 2322 may provide switchable quantified delays. The switchable quantified delays may induce approximately the same delay steps. This may facilitate implementing an algorithm for reducing the skew. However, it is also possible that the switchable quantified delays lead to different delay steps. This may allow for a larger range of introducible delays without requiring increasing the bit width of the signal line addressing the respective programmable delay line. For example, the programmable delay lines 2300, 2310, 2320, 2311, 2312, 2321 and 2322 may be operated with a 4-bit-signal and provide 16 different delay values.

Figure 3:
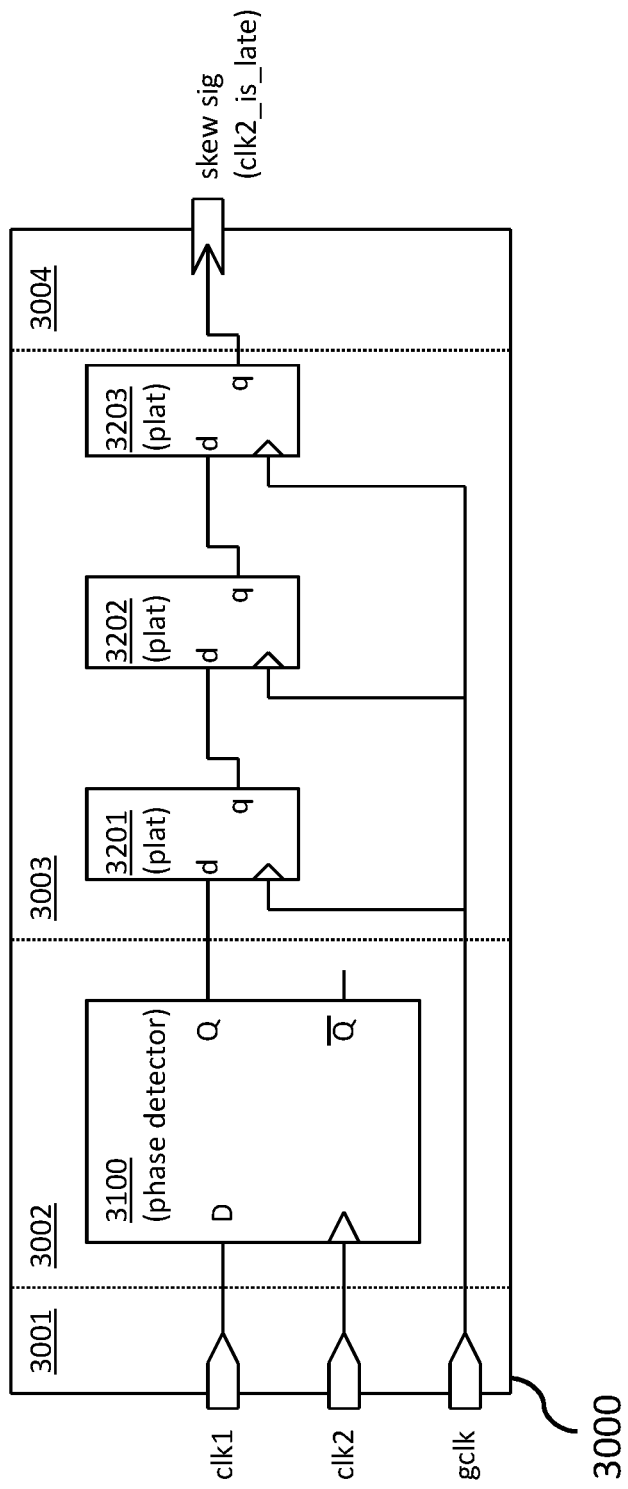
FIG. 3 shows a skew sensor.

FIG. 3 shows an example of a very simple skew sensor 3000 having an input stage 3001, a phase detection stage 3002, a synchronizing stage 3003 and an output stage 3004. The skew sensor 3000 has three inputs clk1, clk2 and gclk. The phase detection stage 3002 may be implemented as a D flip-flop through a phase detector 3100. The output Q is connected to a first pipeline latch 3201, the output q of which is connected to the input of a second pipeline latch 3202, the output q of which is connected to a third pipeline latch 3203. The output q of the third pipeline latch 3203 is then connected to the output of the skew sensor 3004. The other inputs of the first, second and third pipeline latch 3201, 3202 and 3203 are connected to the clock signal gclk. If the edges of the signals clk1 and clk2 arrive very shortly one after the other at the input D of the phase detection stage 3002, it is possible that the output Q of the phase detection stage 3002 does not assume a permissible logic voltage level. For example, the voltage level at the output Q of the phase detection stage 3002 may assume a voltage level corresponding to 75% of the voltage level corresponding to a logic high value. The pipeline latches 3201, 3202, 3203 synchronized with the clock signal gclk serve to obtain a permissible logic voltage value at the output indicating whether the clk2 is late or not.

The outputs of the skew sensors 2410, 2420, 2411, 2412, 2421 and 2422 shown in FIG. 2 indicate whether the clock connected to the upper input of the respective skew sensor is late or not.

Figure 4:
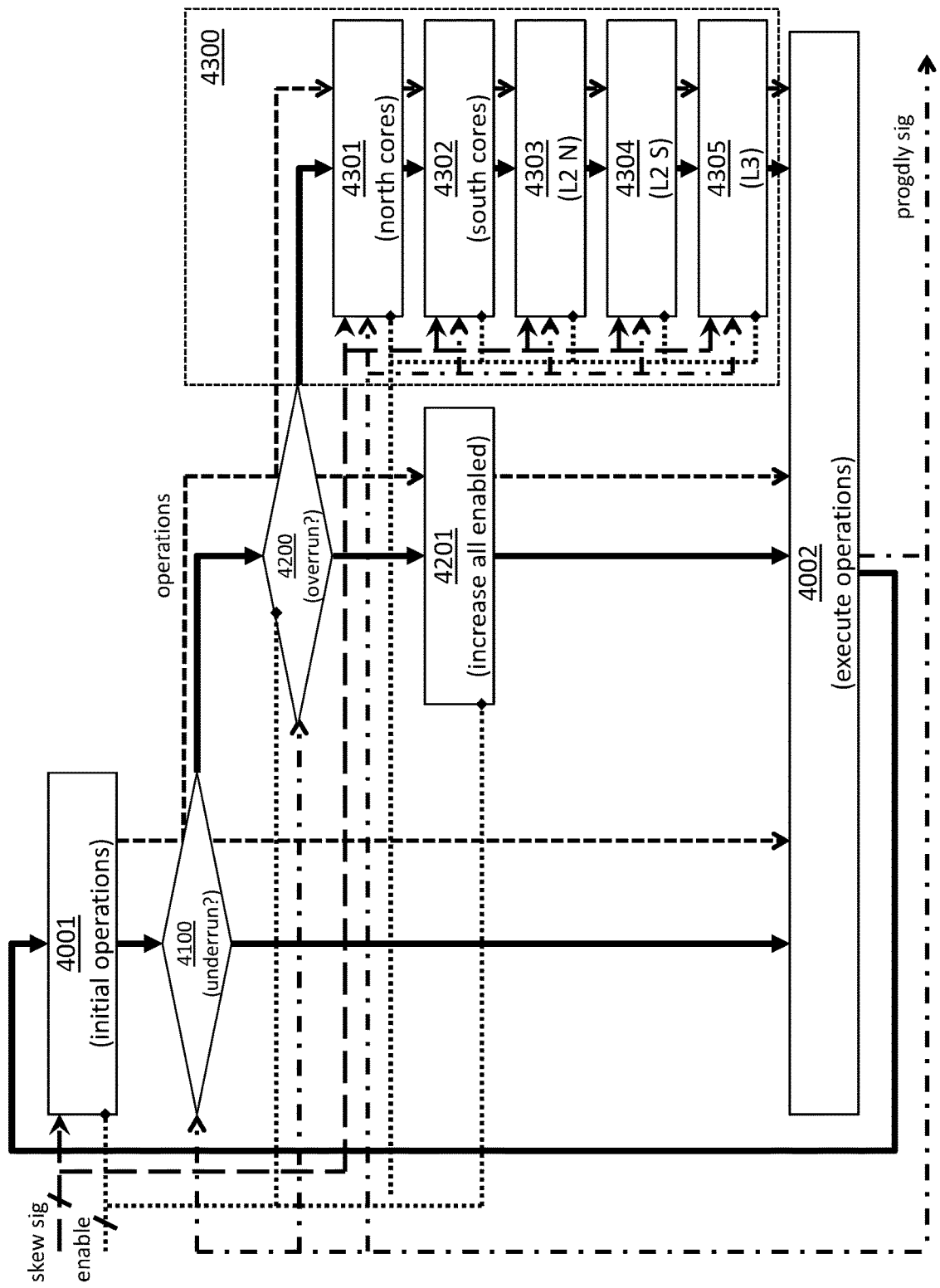
FIG. 4 illustrates an embodiment of a method for operating a synchronous logic device.

FIG. 4 illustrates a method for determining the delay values to be provided to the programmable delay lines 2300, 2310, 2320, 2311, 2312, 2321 and 2322, which may be performed by the skew control circuit 2500.

In a first step 4001, initial operations (indicated with fine dashed arrows) are generated based on the skew signals "skew sig" (indicated with dashed arrows) and the enable signals "enable sig" (indicated with dotted arrows). Operations are commands which change the current delay value induced by the respective programmable delay line 2300, 2310, 2320, 2311, 2312, 2321, 2322.

The initial operations either prescribe reducing the delay value to be provided to a certain programmable delay line or not changing it, i.e., leaving it constant. Preferring decreasing operations for first operations may lead to smaller delay values and, accordingly, a smaller total latency within the hierarchical clock distribution network.

Thereafter, in step 4100, it is verified, based on the current state of the programmable delay lines (indicated with dot dashed arrows), if it is possible to perform all initial operations. For example, a specific programmable delay line may be in a state not allowing a further reduction of the delay. A situation, in which the initial operation for at least one programmable delay line cannot be performed, may also be called an "underrun". In the flow chart shown in FIG. 4 and the following figures the output at the right corner of the diamond always indicates true and the output at the lower corner of the diamond always indicates false.

In case all initial operations can be performed, the initial operations are executed in step 4002. In other words, the current delay values are reduced or maintained and the resulting programmable delay signals "progdly sig" are transmitted to the respective programmable delay lines 2300, 2310, 2320, 2311, 2312, 2321, 2322.

In case an underrun is detected, it is verified in step 4200, based on the current state of the programmable delay lines "progdly sig" and the enable signals, if the delay value can be increased for all programmable delay lines, which are associated with enabled clock domains and for which the initial operation prescribes leaving the delay value constant. For example, the initial operation for the programmable delay line 2311 may not prescribe changing (here: reducing) the delay value of the programmable delay line 2311. This may have two reasons: the clock domain 2111 is not enabled or the clock domain 2111 is not late. If the clock domain 2111 is enabled, the delay value of the associated programmable delay line 2311 is at its maximum value and the initial operation for this programmable delay line 2311 prescribes leaving the delay value constant an overrun is detected, because the delay value of the programmable delay line 2311 cannot be further increased. If the clock domain 2111 is not enabled, it may be not important that the delay value of its associated programmable delay line 2311 cannot be further increased. If for all programmable delay lines 2312, 2311, 2310, 230, 2320, 2321, 2322 no overrun is detected, the initial operations are all increased by the same amount in step 4201. Thereafter, the so modified operations are executed, i.e., the current delay values are increased or maintained the resulting programmable delay signals "progdly sig" are transmitted to the respective programmable delay lines 2300, 2310, 2320, 2311, 2312, 2321, 2322. Only taking enabled clock domains into account in step 4200 may enhance the probability that a common modification for all enabled clock domains in step 4201 may be performed instead of a more cumbersome individual modification of the operations in step 4300.

The individual modification step 4300 may comprise several sub-steps, for example, the sub-steps 4301, 4302, 4303, 4304 and 4305. The sub-steps 4301, 4302, 4303, 4304 and 4305 may be ordered in such a way that analyzing and changing the operations starts with the sub-circuits (or more precisely with the clock domains attributed to them) on the lowest hierarchy level, i.e. sub-circuits not having any daughter sub-circuits, and continues with the sub-circuits on the next hierarchy level. Moreover, within the hierarchy levels, the sub-steps may be ordered such that sub-circuits having the same mother sub-circuit are analyzed one after the other prior to sub-circuits having a different mother sub-circuit.

For example, in the embodiment shown in FIG. 4, in a first sub-step 4301 the clock domains 2111 and 2112 may be analyzed, in a second sub-step 4302 the clock domains 2121, 2122, in a third sub-step 4303 the clock domain 2110, in a fourth sub-step 4304 the clock domain 2120 and in a fifth sub-step 4305 the clock domain 2100.

Figure 5:
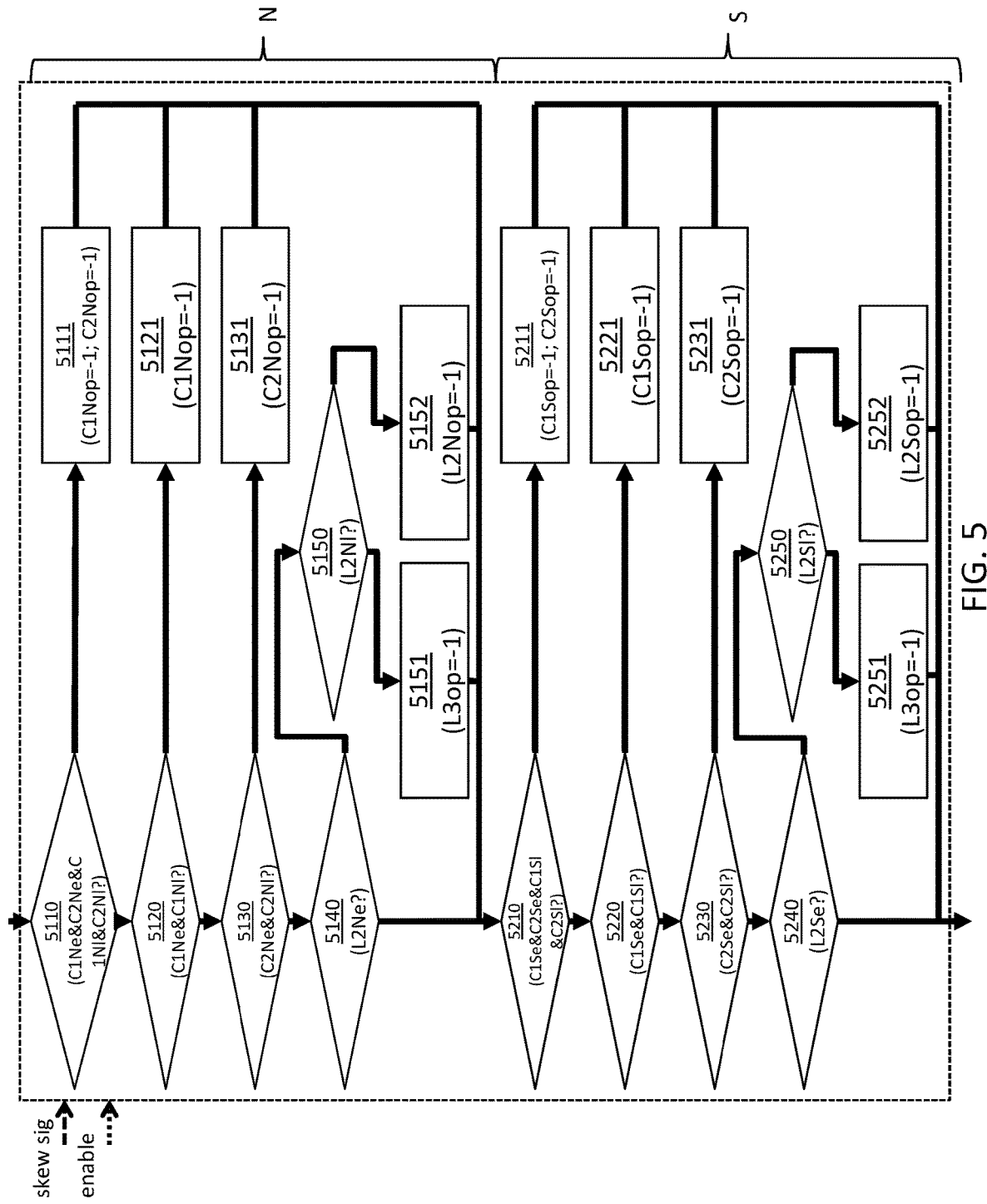
FIG. 5 illustrates an embodiment of step 4001 of FIG. 4.

FIG. 5 illustrates a possibility to generate initial operations. Generating initial operations may start with generating initial operations for the programmable delay line associated with a sub-circuit on the lowest hierarchy level. In the figures the following abbreviations are used: "op" stands for operation, "e" for enabled, "++" for increasing, "z" for zero and "1" for is late.

With respect to the clock distribution network shown in FIG. 2, generating initial operations may start with verifying if the clock domain 2111 is enabled, the clock domain 2112 is enabled, the clock domain 2111 is late and the clock domain 2112 is late (step 5110). If this is the case, the initial operations for both programmable delay lines 2311 and 2312 are set to −1 at step 5111, and generating initial operations continues with the southern branch of the clock distribution network. In the opposite case, the method continues with step 5120.

If it is determined in step 5120 that the clock domain 2111 is enabled and late, the initial operation for the programmable delay line 2311 is set to −1 at step 5121, and generating initial operations continues with the southern branch of the clock distribution network. In the opposite case, the method continues with step 5130.

In case it is determined in step 5130 that the clock domain 2112 is enabled and late, the initial operation for the programmable delay line 2312 is set to −1 at step 5131, and generating initial operations continues with the southern branch of the clock distribution network. In the opposite case the method continues with step 5140.

It may be seen that if any of the tests in steps 5110, 5120 or 5130 results in setting an initial operation of −1 at steps 5111, 5121, and 5131, respectively, the procedure continues with the southern branch of the clock distribution network.

In step 5140 it is verified if the clock domain 2110 is enabled. If this is not the case the method continues with step 5210, otherwise it is determined in step 5150 whether the clock domain 2110 is late. In case the clock domain 2110 is late, the initial operation for the programmable delay line 2310 is set to −1 in step 5152. If the clock domain 2110 is not late, the clock domain 2100 is late at step 5151. Thus, the initial operation for the programmable delay line 2300 is set to −1. In both cases the method continues with step 5210.

Step 5210 continues with verifying if the clock domain 2121 is enabled, the clock domain 2122 is enabled, the clock domain 2121 is late and the clock domain 2122 is late. If this is the case, the initial operations for both programmable delay lines 2321 and 2322 are set to −1 at step 5211, and generating initial operations ends. In the opposite case, the method continues with step 5220.

If it is determined in step 5220 that the clock domain 2121 is enabled and late, the initial operation for the programmable delay line 2321 is set to −1 at step 5221, and generating initial operations ends. In the opposite case, the method continues with step 5230.

In case it is determined in step 5230 that the clock domain 2122 is enabled and late, the initial operation for the programmable delay line 2322 is set to −1 at step 5231, and generating initial operations ends. In the opposite case the method continues with step 5240.

It may be seen that if any of the tests in steps 5210, 5220 or 5230 results in setting an initial operation to −1, the procedure ends.

In step 5240 it is verified if the clock domain 2120 is enabled. If this is not the case the method continues with step 6100, otherwise it is determined in step 5250 whether the clock domain 2120 is late. In case the clock domain 2120 is late, the initial operation for the programmable delay line 2320 is set to −1 in step 5252. If the clock domain 2120 is not late, the clock domain 2100 is late. Thus, the initial operation for the programmable delay line 2300 is set to −1 at step 5251. In both cases the method ends and the method for generating the programmable delay signals of FIG. 4 continues with the underrun detection 4100.

Figure 6:
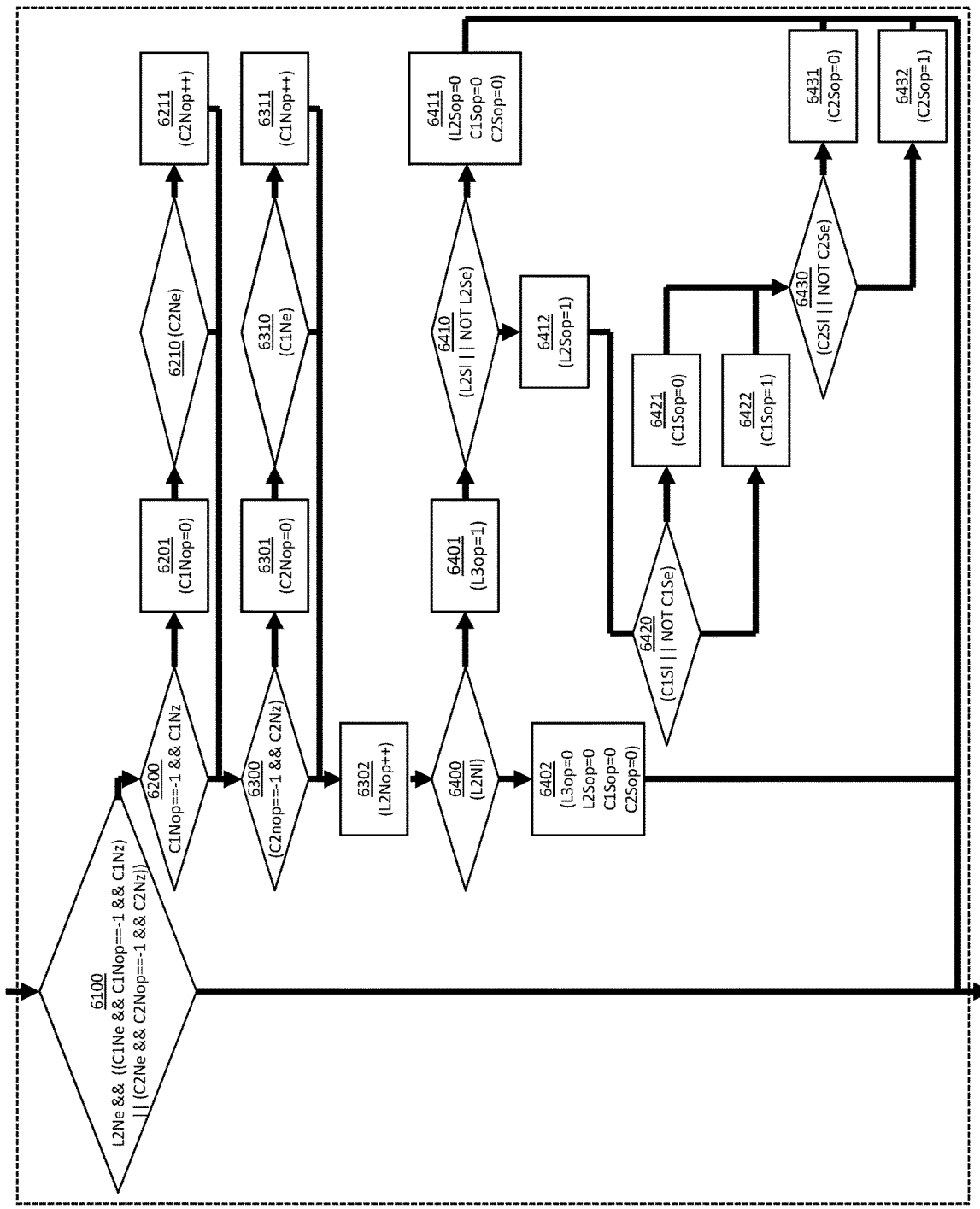
FIG. 6 illustrates an embodiment of step 4301 of FIG. 4.
Figure 7:
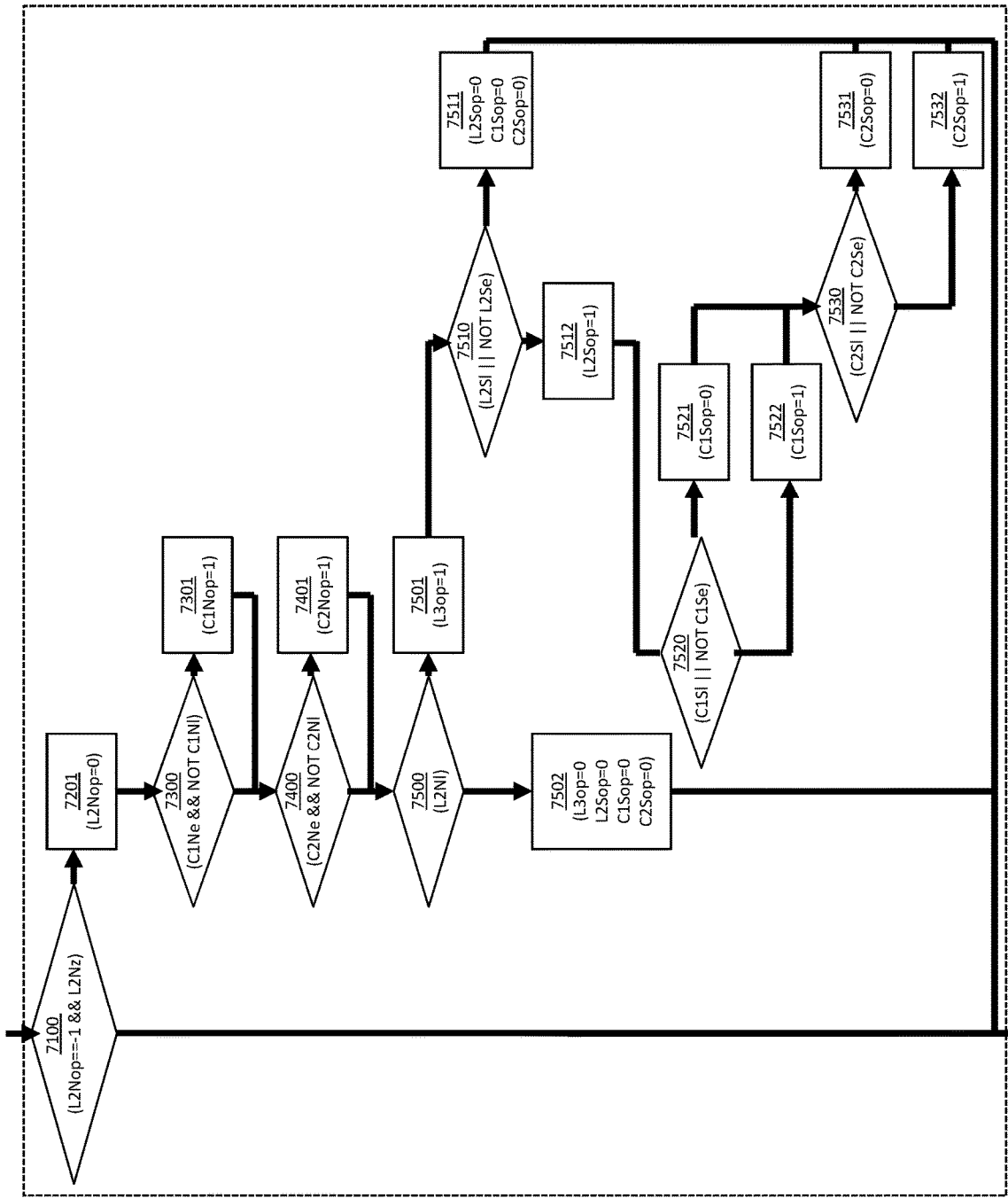
FIG. 7 illustrates an embodiment of step 4303 of FIG. 4.
Figure 8:
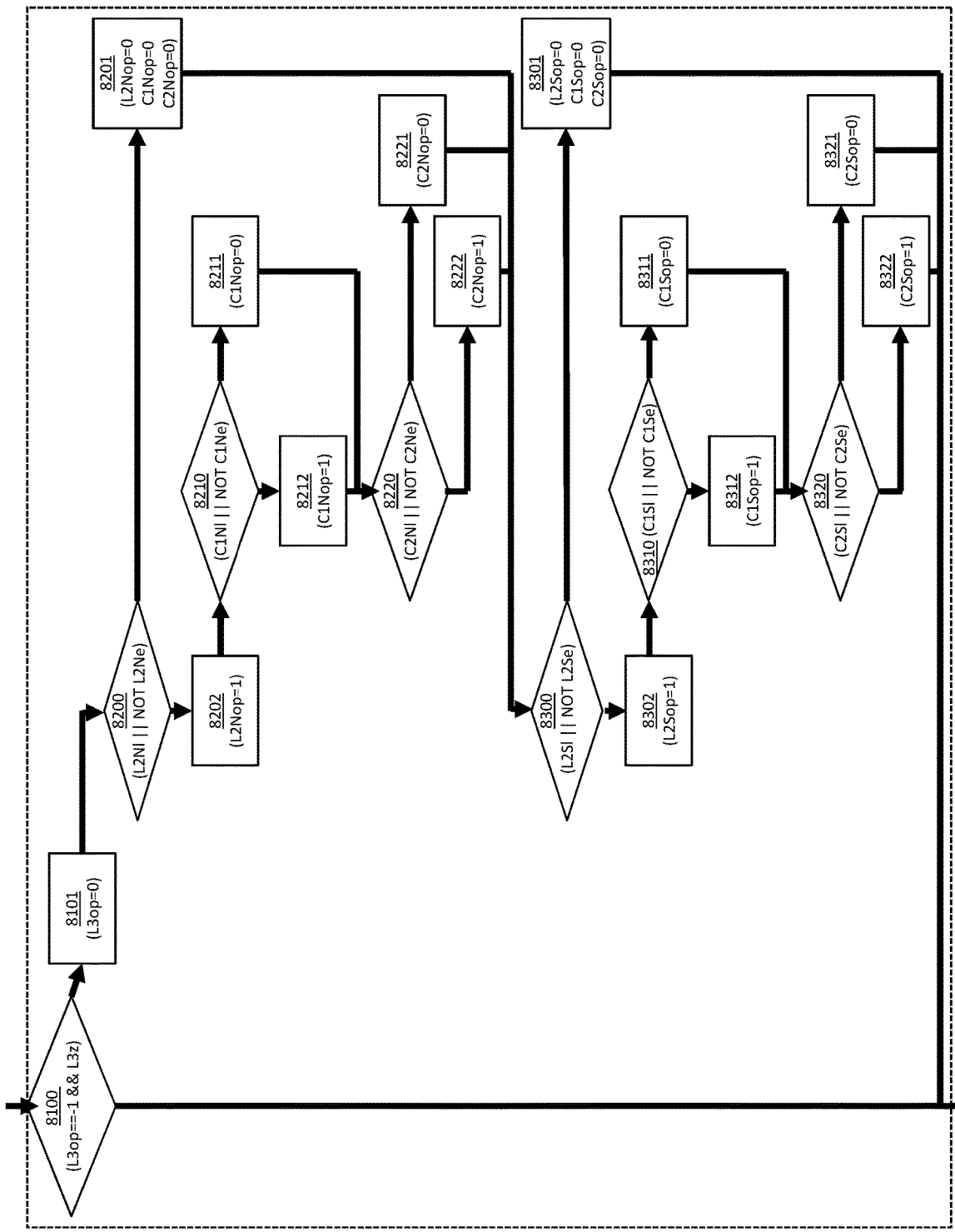
FIG. 8 illustrates an embodiment of step 4305 of FIG. 4.

FIGS. 6 to 8 further illustrate the individual adaptation of the initial operations in case an underrun and an overrun have been determined. As has been explained hereinbefore, it is proposed to start with sub-circuits on the lowest hierarchy level. Moreover, it is suggested to perform the adaption based on the information whether the delay value of a specific programmable delay line cannot be reduced any more. If in the following paragraphs reference is made to sub-circuits being late or enabled, this shall be understood as referring to the respective clock domains being late/enabled. The same applies for references to delays and skews.

FIG. 6 illustrates the first sub-step 4301 of the individual adaptation of the initial operations, which starts with the analyzing the clock domain 2111 and the clock domain 2112. In a first step 6100, it is determined if the mother sub-circuit 1110 of the sub-circuit 1111 and the sub-circuit 1112 is enabled and, in addition, if the sub-circuit 1111 is enabled, the initial operation for the associated programmable delay line 2311 is −1, and the current delay value of the associated programmable delay line 2311 is already at the minimum or if the sub-circuit 1112 is enabled, the initial operation for the associated programmable delay line 2312 is −1, and the current delay value of the associated programmable delay line 2312 is already at the minimum.

If this is the case, it is tested in step 6200 if the initial operation for the programmable delay line 2311 associated with one of the sub-circuits on the lowest hierarchy level, namely the sub-circuit 1111 prescribes reducing the delay value although the delay value is already at the minimum. If this is not the case, the algorithm continues directly with step 6300. Otherwise, the initial operation for the programmable delay line 1111 is set to 0 in step 6201. Thereafter, it is determined if the other sub-circuits of the same mother sub-circuit are enabled (step 6210). If not, the method continues with step 6300. In the opposite case, the other initial operation(s) for the programmable delay line(s) 2312 of the other sub-circuit(s) 1112 on the lowest hierarchy level are incremented (step 6211) and only then step 6300 is performed.

The steps 6300, 6301, 6310 and 6311 essentially correspond to the steps 6200, 6201, 6210, 6211, wherein the focus lies on the other sub-circuit on the lowest hierarchy level, namely the sub-circuit 1112. It is tested in step 6300 if the initial operation for the programmable delay line 2312 associated with the sub-circuit 1112 prescribes reducing the delay value although the delay value is already at the minimum. If this is not the case, the algorithm continues directly with step 6302. Otherwise, the initial operation for the programmable delay line 2312 is set to 0 in step 6301. Thereafter, it is determined if the other sub-circuits of the same mother sub-circuit are enabled (step 6310). If not, the method continues with step 6302. In the opposite case, the other initial operation(s) for the programmable delay line(s) 2311 of the other sub-circuit(s) 1111 on the lowest hierarchy level are incremented (step 6311) and only then step 6302 is performed.

Step 6302 prescribes increasing the delay value of the programmable delay line 2310 associated with the mother sub-circuit 1110 of the sub-circuits 1111 and 1112. This may avoid that the skew between the mother sub-circuit 1110 and the sub-circuits 1111 and 1112 increases if the initial operations for another branch of the mother sub-circuit originally prescribed decreasing the delay value.

Further, it is tested if the sub-circuit 1110 is late (step 6400). If not, the algorithm prescribes setting the operation for the sub-circuit 1100, which is the mother sub-circuit of the sub-circuit 1110, to 0. Moreover, the operations of the sister sub-circuit 1120 and the daughter sub-circuits 1121 and 1122 of the sister sub-circuit 1120 are set to 0 (step 6402). Otherwise, the operation for the sub-circuit 1100, i.e., the mother sub-circuit of the sub-circuit 1110, is set to 1 in step 6401.

Increasing the delay of a sub-circuit higher in the hierarchy may require increasing the delay of sub-circuits lower in the hierarchy being connected to said sub-circuit. It has been found that this is only required when the sub-circuits lower in the hierarchy have not been late before.

In step 6410, it is determined if the sub-circuit 1120 lower in the hierarchy than the sub-circuit 1100 is either late or not enabled, i.e., disabled. If this is the case, the operations for the sub-circuit 1120 and its daughter sub-circuits 1121 and 1122 are set to 0 in step 6411. In the opposite case, the operation for the sub-circuit 1120 is set to 1 (step 6412) and it is determined whether the delay for the daughter sub-circuits of the sub-circuit 1120 has to be increased as well to avoid an increased skew.

Accordingly, it is tested in step 6420 if the first daughter sub-circuit 1121 is either late or disabled. If this is the case, the operation for the respective programmable delay line 2321 is set to 0 (step 6421). If not, the operation for the respective programmable delay line 2321 is set to 1 (step 6422).

In both cases, it is further determined in step 6430 if the other daughter sub-circuit 1122 is either late or disabled. If this is the case, the operation for the respective programmable delay line 2322 is set to 0 (step 6431). If not, the operation for the respective delay line 2322 is set to 0 (step 6432).

Having finished the sub-step 4301 of FIG. 4, an embodiment of which is illustrated in FIG. 6, the algorithm continues with sub-step 4302, which is performed in the very same way as step 4301, wherein queries and operations which have been described for elements of the northern branch of the logic circuit are performed for elements of the southern branch and vice versa.

Thereafter, the algorithm of FIG. 4 continues with analyzing the delay values of the programmable delay lines associated with the sub-circuits on the next hierarchical level, i.e. the sub-step 4303 for the sub-circuit 1110 and the sub-step 4304 for the sub-circuit 1120.

Sub-step 4303 may be further explained with reference to FIG. 7. In a first step 7100 it is determined whether the operation for the programmable delay line associated with the sub-circuit 1110 is −1, and the delay of the programmable delay line 2310 is already at its minimum value. If this is not the case, for example, because the initial operation for the programmable delay line 2310 did not prescribe decreasing the delay or the operation for the programmable delay line 2310 has been increased in step 6302, the algorithm continues with step 4304.

In the opposite case, the operation for the programmable delay line 2310 is set to 0 (step 7201). As the delay induced by the programmable delay line 2310 cannot be reduced as originally prescribed, the delay values of the daughter sub-circuits 1111 and 1112 have to be increased instead provided that they are not already late. Thus, the algorithm continues with testing, whether the sub-circuit 1111 is enabled and not late in step 7300. This being the case, the operation for the sub-circuit 1111 is set to 1 at step 7301, and the method continues with step 7400. Otherwise, the step 7400 directly follows the step 7300.

Correspondingly, in step 7400, it is determined if the sub-circuit 1112 is enabled and not late. If this is the case, the operation for the sub-circuit 1112 is set to 1 (step 7401) and the method continues with step 7500. In the opposite case, the method directly continues with step 7500.

In step 7500 it is tested, if the sub-circuit 1110 is late. If not, the operations for the sub-circuit 1100, the sub-circuit 1120, the sub-circuit 1121 and the sub-circuit 1122 are set to 0 (step 7502). Otherwise, the operation for the sub-circuit 1100, the mother sub-circuit of the sub-circuit 1110, is set to 1 (step 7501). This may require that the operation(s) for the other sub-circuit(s) on the same hierarchy level as the sub-circuit 1110 have to be adapted, too.

Thus, it is determined, if the sub-circuit 1120 is late or disabled (step 7510). If this is the case, the operations for the sub-circuit 1120 and its daughter sub-circuits 1121 and 1122 are set to 0 in step 7511 and the sub-step 4303 ends. Otherwise, the operation for the sub-circuit 1120 is set to 1 (step 7512) and the method continues with the daughter sub-circuits 1121 and 1122 of the sub-circuit 1120. First, if the sub-circuit 1121 is late or not enabled (step 7520) the operation for this sub-circuit 1121 is set to 0 (step 7521). In the opposite case, the operation for this sub-circuit 1121 is set to 1 (step 7522). In both cases, it is then tested if the sub-circuit 1122 is late or not enabled (step 7530) and in the positive case the operation for the sub-circuit 1122 set to 0 at step 7531, and in the negative case the operation for the sub-circuit 1122 is set to 1 at step 7532, and the method shown in FIG. 4 continues with sub-step 4304. Sub-step 4304 may be performed correspondingly to sub-step 4303.

Thereafter, the method of FIG. 4 continues with the next hierarchy level in sub-step 4305. A possible embodiment of sub-step 4305 is further explained in FIG. 8.

In a first step 8100 it is determined if the operation for the sub-circuit 1100 prescribes reducing the delay value although the programmable delay line 2300 is already at the minimum. If this is not the case, sub-step 4305 ends and the delay values are sent to the respectively programmable delay lines in step 4002 as has been explained above. Otherwise, the operation for the sub-circuit 1100 is set to 0 in step 8101 and the operations for the direct or indirect daughter sub-circuits are modified.

In step 8200, it is tested if the sub-circuit 1110 is either late or disabled. If this is the case, the operations for the sub-circuit 1110, the sub-circuit 1111 and the sub-circuit 1112 are set to 0 (step 8201) and it is continued with step 8300. Otherwise, the operation for the sub-circuit 1110 is set to 1 (step 8202). Thereafter, the operations of the daughter sub-circuits 1111 and 1112 of the sub-circuit 1110 are set. Heretofore, it is determined if the sub-circuit 1111 is late or disabled (step 8210). If this is the case, the operation for the sub-circuit 1111 is set to 0 (step 8211). Otherwise, the operation for the sub-circuit 1111 is set to 1 (step 8212). In both cases, the algorithm continues with step 8220.

In step 8220, it is tested if the sub-circuit 1112 is late or disabled. If this is the case, the operation for the sub-circuit 1112 is set to 0 in step 8221. If not, the operation for the sub-circuit 1112 is set to 1 in step 8222. After steps 8221 and 8222, the algorithm continues with step 8300.

In step 8300, it is tested if the sub-circuit 1120 is either late or disabled. If this is the case, the operations for the sub-circuit 1120, the sub-circuit 1121 and the sub-circuit 1122 are set to 0 at step 8301, and it is continued with step 4002 in FIG. 4. Otherwise, the operation for the sub-circuit 1120 is set to 1 (step 8302). Thereafter, the operations of the daughter sub-circuits 1121 and 1122 of the sub-circuit 1120 are set. Heretofore, it is determined if the sub-circuit 1121 is late or disabled (step 8310). If this is the case, the operation for the sub-circuit 1121 is set to 0 (step 8311). Otherwise, the operation for the sub-circuit 1121 is set to 1 (step 8312). In both cases, the algorithm continues with step 8320.

In step 8320, it is tested if the sub-circuit 1122 is late or disabled. If this is the case, the operation for the sub-circuit 1122 is set to 0 in step 8321. If not, the operation for the sub-circuit 1122 is set to 1 in step 8322.

FIGS. 9A to 9F illustrate the adaptation of the programmable delay lines. In the situation shown in FIG. 9A only the sub-circuits L3 as well as L2 N are enabled and the sub-circuits Core 1 N as well as Core 2 N are not enabled (indicated with dotted surroundings). The clock domains of both sub-circuits L3 and L2 N have a certain, differing internal delay "internal". The programmable delay line associated with the sub-circuit L2 N introduces a delay "progdly" to reduce the skew between the clocks of the clock domains. Thus, in the example shown in FIG. 9A, the internal delay of the clock domain associated with the sub-circuit L3 determines the overall latency of the clock distribution network.

Figure 9A:
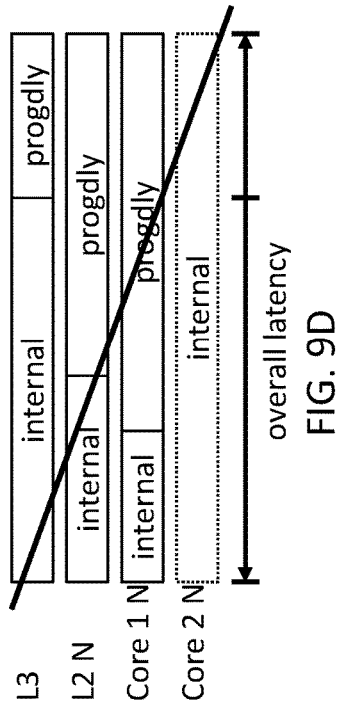
FIG. 9A-9F illustrate internal and programmable delays as well as overall latencies.
Figure 9B:
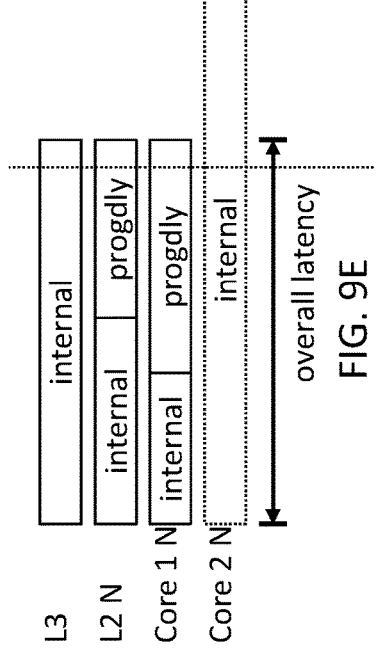

Shown in FIG. 9B is the situation when the sub-circuit Core 1 N is enabled. In the example, the sub-circuit Core 1 N has a lower internal delay than both the sub-circuit L3 and the sub-circuit L2 N. Thus, it is sufficient to amend only the delay value introduced by programmable delay line associated with the clock domain associated with the sub-circuit Core 1 N. The delay value of the programmable delay line associated with the sub-circuit L2 N can remain. Moreover, enabling the sub-circuit Core 1 N does not change the overall latency.

Figure 9C:
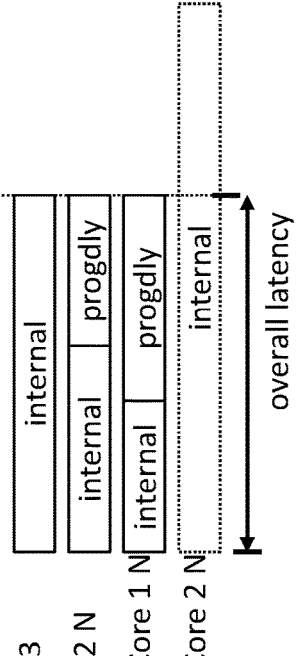

In FIG. 9C, the sub-circuit Core2 N is also enabled. The internal delay of the sub-circuit Core 2 N is higher than the internal delay of the sub-circuit L3, the sub-circuit L2 N and the sub-circuit Core 1 N. Thus, deskewing the enabled sub-circuits requires more than changing the delay value of the programmable delay line associated with the sub-circuit Core 2N. The delay values of the programmable delay lines associated with the sub-circuit L3, the sub-circuit L2 N and the sub-circuit Core 1 N have to be increased. Accordingly, the overall latency augments.

Figure 9D:
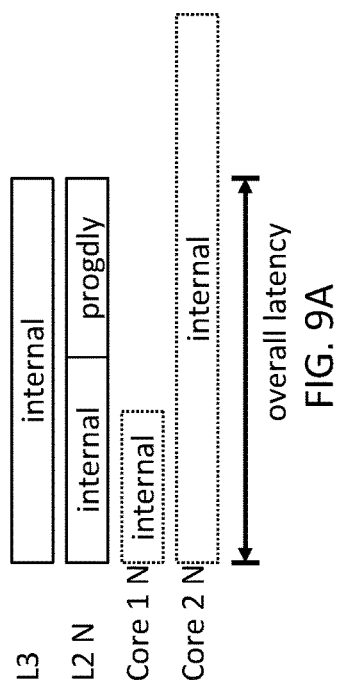

FIG. 9D shows a situation, in which the sub-circuit Core 2 N has been disabled again. As may be seen, the clock domains of the sub-circuit L3, the sub-circuit L2 N and the sub-circuit Core 1 N remain deskewed. However, the overall latency of the clock domain network is higher than required. This may induce jitter. Thus, this situation is deprecated.

Figure 9E:
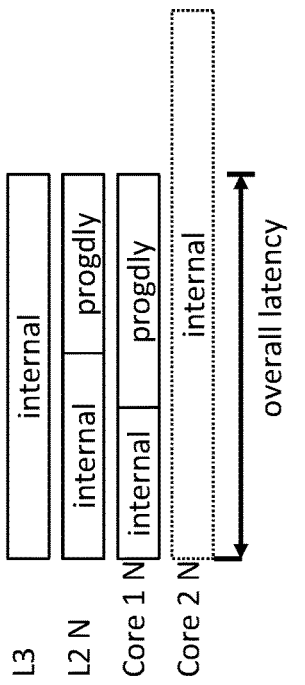

Instead, as shown in FIG. 9E, the delay values of the programmable delay lines associated with the sub-circuit L3, the sub-circuit L2 N and the sub-circuit Core 1 N are all to be reduced to achieve minimum latency.

Figure 9F:
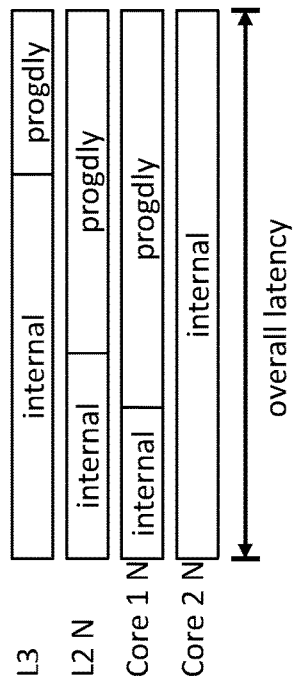

FIG. 9F shows that the method described hereinbefore is also adapted to handle situations, in which the internal delay of a clock domain associated with a specific sub-circuit, e.g., the sub-circuit L3, changes.

Figure 10:
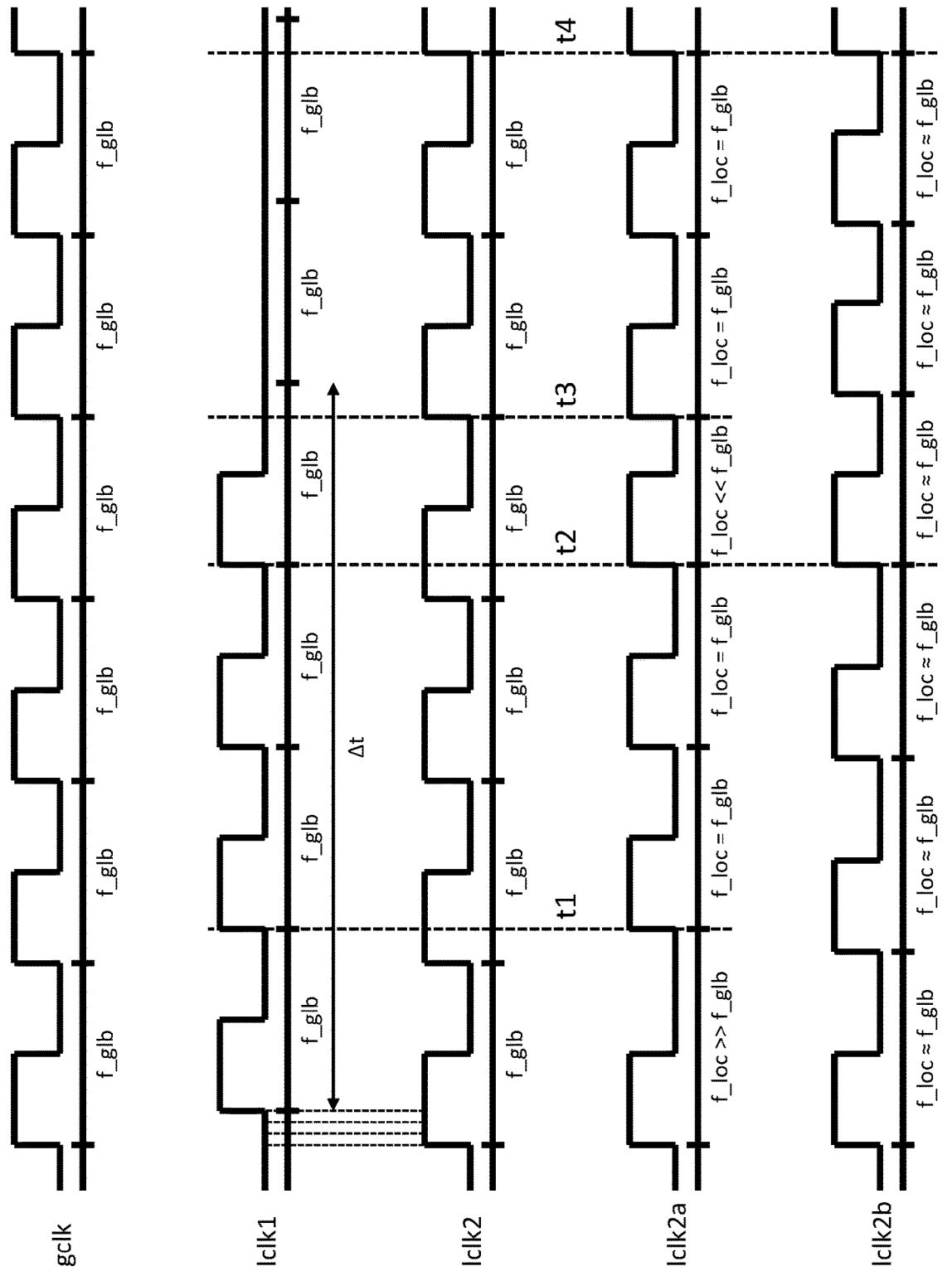
FIG. 10 illustrates incremental adaptation of programmable delay lines.

FIG. 10 shows exemplary clock signals gclk, lclk1, lclk2, lclk2a and lclk2b for explaining one of the advantages of the current disclosure. The clock signal lclk1 is only active for an interval Δt and has an internal delay of three increments with respect to the clock signal lclk2. The skew between the clock signal lclk1 and the clock signal lclk2 shall be reduced. Thus, the clock signal lclk2 has to be delayed using a programmable delay line. After the interval Δt the clock signal lclk1 is no longer active and a minimum latency is intended. Accordingly, the additional delay of lclk2 has to be removed again.

According to a first approach lclk2a, the lclk2 is directly delayed by three increments after activation of the clock signal lclk1 and the delay of three increments directly removed after the interval Δt. Thus, the skew is removed already at time t1 and the latency managed/reduced/lessened/minimized at time t3. However, directly changing the delay be three increments leads to an abrupt change in the local frequency f_loc, which may cause malfunctioning of the associated sub-circuit. Thus, the method described hereinbefore proposes to change the delay by only one increment at a time as shown by lclk2b. Accordingly, the skew is removed only at time t2 and the latency only managed/reduced/lessened/minimized at time t4. Thus, changing the delay by only one increment may have the advantage of a local frequency f_loc having approximately the value of the original frequency while changing the delay by more increments may have the advantage of a faster deskewing.

Many simple skew sensors, for example the skew sensor 3000 shown in FIG. 3, can only detect, which of both edges of two input clock signals is later than the other. Thus, a skew control circuit may permanently change the settings of the programmable delay lines in the opposite direction with every clock cycle, because it always assumes that one of the two clock signals is late even if the skew between the two clock signals cannot be further reduced.

A "sync good"-signal may be generated in case the operations for a certain programmable delay line have switched m times from increasing to decreasing, for example. Alternatively or in addition, the "sync good" signal may be generated after a predetermined fixed number of clock cycles. The "sync good"-signal indicating that all enabled clock domains are deskewed may avoid that the continuous changing of the settings of the programmable delay lines increases power consumption and a fluctuating local frequency.

Figure 11:
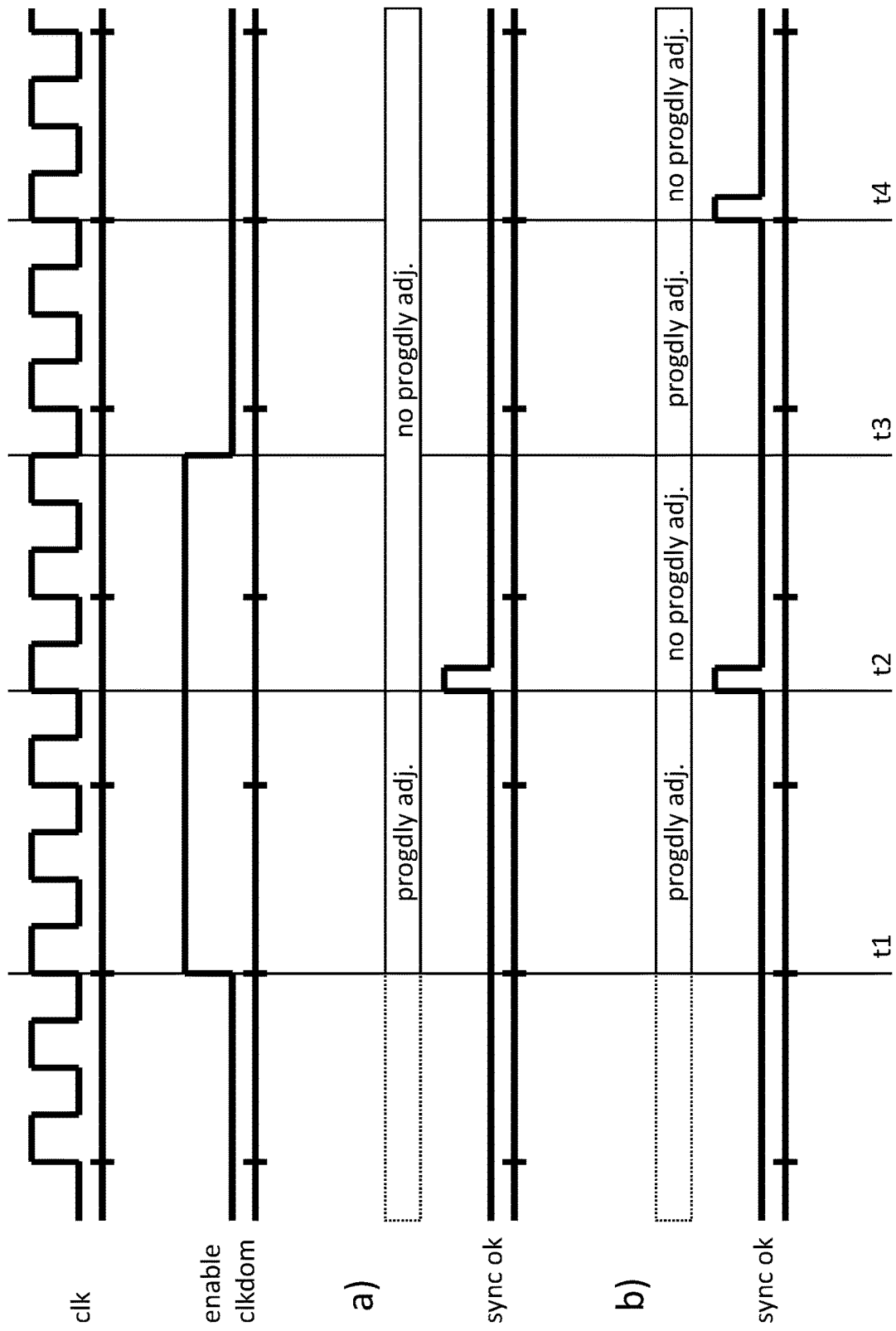
FIG. 11 illustrates discontinuous programmable delay line adjustment.

As shown in FIG. 11, an additional clock domain of a logic circuit, for example the logic circuit described with reference to FIG. 2, may be enabled at time t1. The additional clock domain may be not synchronized with the other clock domains of the logic circuit. Thus, adjusting the programmable delay lines is required as indicated with "progdly adj." as shown in a). After a certain time, the clock domains of the logic circuit have been deskewed and a "sync ok" signal is generated. Thereafter, continuously measuring skews and adjusting the programmable delay lines stops even after the additional clock domain is disabled again, because the logic circuit remains deskewed.

However, as has been explained above with reference to FIG. 9D, this may lead to an overall latency which is larger than required. Thus, it is proposed to adjust the programmable delay lines after a clock domain has been disabled as shown in the part b) of FIG. 11.

Figure 12B:
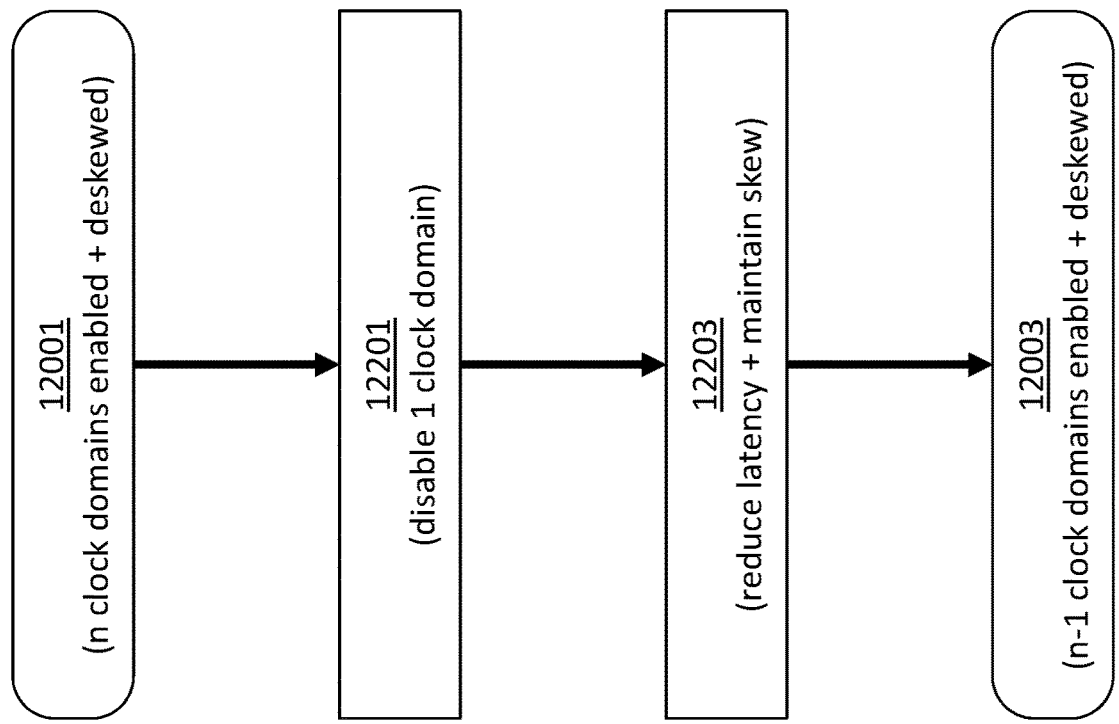
FIG. 12A-12B illustrate a method for operating a synchronous logic device.
Figure 12A:
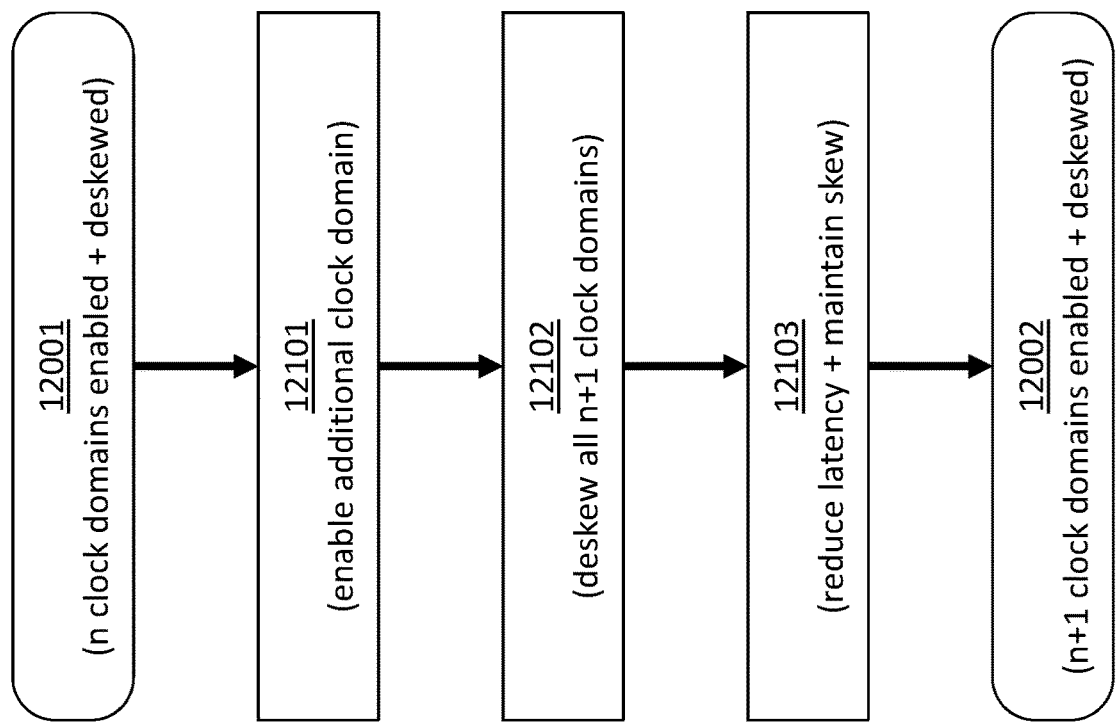

FIGS. 12A and 12B further explain a method for synchronizing the clock domains of sub-circuits if an additional domain is enabled (FIG. 12A) and if one of the clock domains is disabled (FIG. 12B).

Both procedures start with a situation 12001, in which all currently enabled n clock domains are deskewed.

In case a further clock domain is enabled (step 12101), deskewing of all (n+1) clock domains is performed (step 12102). Thereafter, the overall latency is reduced while maintaining the skew (step 12103). Finally, as a result, the (n+1) clock domains are enabled, deskewed and have minimal latency (step 12002).

Disabling a clock domain (step 12201) may require only reducing the latency of the clock distribution network (step 12203). Reducing the latency of the clock distribution network having (n−1) clock domains enabled may comprise determining if the programmable delay line associated with the disabled clock domain introduced a delay. If this is not the case, it may be concluded that the disabled clock domain determined the overall delay of the clock distribution network. Thus, the delays for all other clock domains may be reduced by the same amount to achieve minimal latency and deskewed at step 12003. If the programmable delay line associated with the disabled clock domain does introduce a delay, it may be concluded that another programmable delay line is already at its minimum value. Accordingly, it is not possible to reduce the delays for all still enabled clock domains by the same domains as the clock distribution network already operates at the minimal latency.

In addition to embodiments described above, other embodiments having fewer operational steps, more operational steps, or different operational steps are contemplated. Also, some embodiments may perform some or all of the above operational steps in a different order. In embodiments, operational steps may be performed in response to other operational steps. The modules are listed and described illustratively according to an embodiment and are not meant to indicate necessity of a particular module or exclusivity of other potential modules (or functions/purposes as applied to a specific module).

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Embodiments according to this disclosure may be provided to end-users through a cloud-computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud-computing resources are provided to a user on a pay-per-use basis, where users are charged only for the computing resources actually used (e.g., an amount of storage space used by a user or a number of virtualized systems instantiated by the user). A user can access any of the resources that reside in the cloud at any time, and from anywhere across the Internet. In context of the present disclosure, a user may access applications or related data available in the cloud. For example, the nodes used to create a stream computing application may be virtual machines hosted by a cloud service provider. Doing so allows a user to access this information from any computing system attached to a network connected to the cloud (e.g., the Internet).

Embodiments of the present disclosure may also be delivered as part of a service engagement with a client corporation, nonprofit organization, government entity, internal organizational structure, or the like. These embodiments may include configuring a computer system to perform, and deploying software, hardware, and web services that implement, some or all of the methods described herein. These embodiments may also include analyzing the client's operations, creating recommendations responsive to the analysis, building systems that implement portions of the recommendations, integrating the systems into existing processes and infrastructure, metering use of the systems, allocating expenses to users of the systems, and billing for use of the systems.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to exemplary embodiments, other and further embodiments of the invention may be devised without departing from the basic scope thereof, and the scope thereof is determined by the claims that follow. The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. "Set of," "group of," "bunch of," etc. are intended to include one or more. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of exemplary embodiments of the various embodiments, reference was made to the accompanying drawings (where like numbers represent like elements), which form a part hereof, and in which is shown by way of illustration specific exemplary embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

What is claimed is:

1. A clock distribution network of a synchronous logic device, wherein the synchronous logic device comprises multiple sub-circuits belonging to different clock domains:
   wherein the clock distribution network comprises
   a clock source operable for providing a global clock signal,
   at least one programmable delay line associated with a certain sub-circuit operable for generating wherein the programmable delay lines are operable for delaying the global clock signal or the signal derived therefrom by a number of delay increments,
   a local clock signal for said sub-circuit by delaying the global clock signal or a signal derived therefrom;
   a global skew control circuit for managing clock skew between the local clock signals; and
   wherein the global skew control circuit is operable for adjusting a delay caused by the delay line,
      determining initial operations for the delay lines for either reducing a delay caused by the respective programmable delay line or leaving the delay constant,
      verifying, based on a current state of the delay lines, whether it is possible to perform the initial operations, and,
      based on the verifying, performing a correction operation, the correction operation comprising
      correcting the control commands such that the corrected commands lead to the same change of skew adjustment between the local clocks, the corrected commands including at least one control command for increasing a delay caused by a programmable delay line
      wherein the command includes a positive or negative number of increments by which the delay caused by a particular programmable delay line shall be adjusted, and
   wherein the correction operation comprises:
      checking whether all programmable delay lines controlled by the global skew control circuit can increase the respective number of delay increments; and,
      if the result of the checking is that all programmable delay lines can increase the respective delay then increasing the number of increments of each determined command;
      if the result of the checking is that at least one programmable delay line cannot increase the number of delay increments then iteratively determining corrected commands for each programmable delay line controlled by the global skew control circuit starting with a programmable delay line associated with a clock domain located at the bottom of the hierarchical structure;
   wherein the global skew control circuit is further operable for:

transitioning into the deskewing operating mode in response to enabling and/or disabling clock domains; and transitioning into the deskewing operating mode in response to disabling the clock domain associated with the programmable delay line causing the lowest delay among the programmable delay lines of enabled clock domains.

2. The clock distribution network according to claim 1, wherein the clock domains form a hierarchical structure.

3. The clock distribution network according to claim 1, wherein the verifying comprises checking whether the control commands include at least one command destined to a programmable delay line that operates already at a minimum delay.

4. The clock distribution network according to claim 1, wherein the synchronous logic device comprises a microprocessor and wherein the sub-circuits comprise at least one of a processor core including a first level cache,
a second level cache, or
a third level cache.

5. The clock distribution network according to claim 1, wherein the global skew control circuit is operable for managing clock skew between at least some local clock signals by regularly adjusting the delay caused by at least one programmable delay line when in a deskewing operating mode, and disabling adjusting the delays of the programmable delay lines when in a locked operating mode.

6. The clock distribution network according to claim 1, further comprising at least one skew sensor adapted for generating a sensor signal indicative of a clock skew between two local clock signals, wherein the global skew control circuit is operable for
repeatedly acquiring the sensor signal of the at least one skew sensor,
comparing sensor signals acquired at different points in time with each other, and
transitioning to the locked operating mode based on the comparison.

7. A method for operating a synchronous logic device, wherein the synchronous logic device comprises
multiple sub-circuits belonging to different clock domains and the clock domains form a hierarchical structure,
wherein the method comprises:
providing a global clock signal,
generating a local clock signal by delaying with a programmable delay line the global clock signal or a signal derived therefrom, and managing clock skew between the local clock signals,
wherein managing clock skew between local clock signals comprises:
adjusting a delay caused by the delay line,
determining initial operations for the delay lines for either reducing a delay caused by the respective programmable delay line or leaving the delay constant,
verifying, based on a current state of the delay lines, whether it is possible to perform the initial operations and, based on the verifying, performing a correction operation, the correction operation comprising correcting the control commands such that the corrected commands lead to the same change of skew adjustment between the local clocks, the corrected commands including at least one control command for increasing a delay caused by a programmable delay line managing clock skew between at least some local clock signals by regularly adjusting the delay caused by at least one programmable delay line when in a deskewing operating mode;

disabling adjusting the delays of the programmable delay lines when in a locked operating mode;

selectively enabling or disabling clock domains, and transitioning into the deskewing operating mode in response to disabling the clock domain associated with the programmable delay line causing the lowest delay among the programmable delay lines of enabled clock domains.

8. The method according to claim 7,
wherein verifying comprises checking whether the control commands include at least one command destined to a programmable delay line that operates already at a minimum delay.

9. The method according to claim 8,
wherein the programmable delay lines are operable for delaying the global clock signal or the signal derived therefrom by a number of delay increments,
wherein the command includes a positive or negative number of increments by which the delay caused by a particular programmable delay line shall be adjusted, and
wherein the correction operation comprises checking whether all programmable delay lines can increase the respective number of delay increments, and,
if the result of the checking is that all programmable delay lines can increase the respective delay then increasing the number of increments of each determined command.

10. The method according to claim 9, wherein the correction operation comprises,
if the result of the checking is that at least one programmable delay line cannot increase the number of delay increments then iteratively determining corrected commands for each programmable delay line controlled by the global skew control circuit starting with a programmable delay line associated with a clock domain located at the bottom of the hierarchical structure.

11. The method according to claim 7,
wherein the clock distribution network comprises at least one skew sensor adapted for generating a sensor signal indicative of a clock skew between two local clock signals, and
wherein the method comprises
repeatedly acquiring the sensor signal of the at least one skew sensor,
comparing sensor signals acquired at different points in time with each other, and
transitioning to the locked operating mode based on the comparison.

* * * * *